United States Patent
New et al.

[11] Patent Number: 6,060,785
[45] Date of Patent: May 9, 2000

[54] METHOD OF IMPROVING ALIGNMENT SIGNAL STRENGTH BY REDUCING REFRACTION INDEX AT INTERFACE OF MATERIALS IN SEMICONDUCTORS

[75] Inventors: Daryl C. New, Meridian; Thomas M. Graettinger, Boise, both of Id.

[73] Assignee: Micron Technology, Inc., Boise, Id.

[21] Appl. No.: 09/304,503

[22] Filed: May 3, 1999

Related U.S. Application Data

[62] Division of application No. 08/887,612, Jul. 3, 1997.

[51] Int. Cl.⁷ .................................................. H01L 23/544
[52] U.S. Cl. ........................................... 257/797; 257/431
[58] Field of Search .................................... 257/797, 431, 257/437

[56] References Cited

U.S. PATENT DOCUMENTS

| | | |
|---|---|---|
| 4,007,846 | 2/1977 | Tustison et al. . |
| 4,320,936 | 3/1982 | Sawamura . |
| 4,480,331 | 10/1984 | Thompson . |
| 5,160,957 | 11/1992 | Ina et al. . |
| 5,252,414 | 10/1993 | Yamashita et al. . |
| 5,266,511 | 11/1993 | Takao et al. . |
| 5,528,372 | 6/1996 | Kawashima . |
| 5,532,871 | 7/1996 | Hashimotoe et al. . |
| 5,541,037 | 7/1996 | Hatakeyama et al. . |
| 5,760,483 | 6/1998 | Bruce et al. . |
| 5,933,743 | 8/1999 | New et al. . |

*Primary Examiner*—Sheila V. Clark
*Attorney, Agent, or Firm*—Trask, Britt & Rossa

[57] ABSTRACT

A method and resulting structure for reducing refraction and reflection occurring at the interface between adjacent layers of different materials in a semiconductor device, assembly or laminate during an alignment step in a semiconductor device fabrication process. The method comprises forming a first layer of material, having a first index of refraction, over a substrate of the semiconductor device, assembly or laminate. A corrective layer is formed over the first layer and a second layer, having a second index of refraction, is then formed over the corrective layer. The corrective layer is composed of a material having an intermediate index of refraction between the first index of refraction and the second index of refraction. The method can also be modified to include one or more layers of materials and/or intermediate refraction layers interposed between or above any of the aforementioned adjacent layers. The aforementioned method and resulting structures can be further modified by forming an additional layer of material, having the requisite intermediate index of refraction, over an uppermost layer to further reduce reflection occurring at the interface between the uppermost layer and air. The invention is also directed to semiconductor devices, assemblies or laminates formed through the aforementioned methods and incorporating the aforementioned structures.

24 Claims, 4 Drawing Sheets

METHOD OF IMPROVING ALIGNMENT SIGNAL STRENGTH BY REDUCING REFRACTION INDEX AT INTERFACE OF MATERIALS IN SEMICONDUCTORS

CROSS REFERENCE TO RELATED APPLICATION

This application is a divisional of application Ser. No. 08/887,612, filed Jul. 3, 1997, pending.

This invention was made with Government support under Contract Nos. MDA972-93-C-0033 and MDA972-94-C-0006 awarded by the Advanced Research Projects Agency (ARPA). The U.S. Government has certain rights in this invention.

BACKGROUND OF THE INVENTION

1. Field of the Invention

The present invention relates generally to a method for improving the signal strength of light reflected from buried semiconductor layers in a semiconductor device or assembly and the resulting semiconductor devices formed thereby. More specifically, the invention relates to an improved method for reducing reflection caused by differences in the refractive index at the interfaces of adjacent layers of two or more materials in a semiconductor device or assembly by inserting therebetween a layer of material having a refractive index intermediate the refractive indexes of the previously-adjacent layers of materials.

2. State of the Art

Increased integration and density of modern semiconductor integrated circuits require increasing the accuracy of alignment-based operations and patterning processes. Specifically, resolution and alignment accuracy are basic performance requirements in alignment and exposure apparatuses used in the field of manufacturing semiconductor devices. For example, precise position alignment (i.e., "mask alignment") is required each time a mask pattern is reduced in size and transferred to a silicon wafer, other substrate of silicon, or other semiconductor material by optical reduction-photolithographic techniques. Likewise, a precise position alignment is required where a laser trimming apparatus is used to cut sections or levels of the semiconductor on a semiconductor device pattern. These requirements, coupled with the ongoing tendency to further miniaturization and higher capacity of semiconductor devices, have demanded further improvements in the resolution and alignment accuracy used in today's semiconductor manufacturing processes.

During the manufacturing process, movement of the device or expansion and contraction of a device pattern often produces differences between locations resident in a design-based coordinate system of a device pattern (hereinafter "coordinate system") and execution according to the coordinate system by an apparatus responsible for a fabrication step, such as a laser trimming apparatus. That is, unless the coordinate system of the device pattern on the silicon wafer coincides with that actually employed by the fabrication apparatus, it is impossible for the fabrication apparatus to properly align itself onto a precise position on the wafer and to carry out patterning, additive, or subtractive steps in the manufacturing process. For example, where a laser trimming apparatus is used to cut a fuse on a device pattern, the misalignment of the laser trimming apparatus results in an improperly-aligned fuse position, a variation which ultimately results in a cutting failure.

To make an operation executed by the fabrication apparatus precisely coincide with the coordinate system, a plurality of alignment marks is typically formed on the device pattern. Each of the alignment marks is constructed of a highly reflective material, such as aluminum, and is surrounded by a field region devoid of reflective material.

In conventional alignment methods utilizing the aforementioned alignment marks, the device pattern is scanned with light of varying wavelengths emanating from an alignment apparatus (e.g., a laser beam) along an x- or y- axis of the coordinate system. Variation in the amount of light reflected vertically from the reflective layer is then detected each time the alignment apparatus scans the area overlying an alignment mark. In this manner, the position of each of the alignment marks is detected. Based on the detected coordinates of the alignment marks, the position of the fabrication apparatus or device pattern is adjusted so that the fabrication apparatus is positioned precisely at a point that coincides with the coordinate system of the device pattern.

During the manufacturing process, the alignment marks are generally covered with one or more layers of light-transmissive materials, such as polysilicon, resist, insulator, and combinations of other suitable and known films. These intervening layered materials create optical interference with the beam of light traveling between the alignment apparatus and the alignment mark during alignment steps in subsequent phases of the fabrication process. Specifically, as light passes through the interface between two thin-film layers of dielectric, non-absorbing materials having different indexes of refraction, reflection of the light passing therethrough increases. This reflective effect increases as the difference between the indexes of refraction between two adjacent layers increases.

Reflection can cause alignment problems by reducing the incident light signal reaching the alignment marks. Additionally, when the light signal is reflected from the alignment marks back to the alignment apparatus, the strength and resolution of the light signal undergoes additional reflection as the light signal passes through each interface between adjacent layers of overlying material.

Several solutions have been proposed in the prior art to solve the above-mentioned problems associated with alignment inaccuracies due to reflection in semiconductor devices. For example, various alignment systems for use with projection (photoresist) exposure apparatus have utilized an alignment light, having a wavelength that is different from that of an exposing light and that is within the visible wavelength region, in order to enable observation of a wafer surface during the alignment procedure.

Another proposed solution involves formation of a transparent anti-reflective film on a top surface of a resist layer and peeling the film after exposure in order to form a fine resist pattern to high dimensional and alignment accuracies. The use of a low index of refraction material as the anti-reflective film results in a reduction of reflected light at the interface between the resist layer and anti-reflective film, thus improving the dimensional accuracy of a resist image. An alternative method requires removal of a portion of a cover film deposited over the alignment marks to eliminate reflection caused by the cover film.

Other proposed approaches have involved modification of an optical system used with the projection exposure apparatus. For instance, U.S. Pat. No. 5,532,871 to Hashimoto et al. discloses a two-wavelength anti-reflection film consisting of alternately laminated layers of low and intermediate refractive index materials which are applied to the faces of the mirrors and lenses of an optical system.

Although the aforementioned methods eliminate a number of alignment problems which occur as a result of reflection between the layered materials, these methods also possess a number of shortcomings. For example, the inclusion of anti-reflective layers or films is limited to the top surface of the uppermost layer (usually a resist in the case of photolithography processes). While this approach does provide a more defined light signal, it does not necessarily improve overlay accuracy of the geometries which are patterned from level to level during the fabrication process. Other previously-identified methods require specialized fabrication steps (e.g., removal of the portion of film covering the alignment mark) and equipment, which requirements result in increased fabrication costs and production times.

In view of the foregoing limitations, there is a need in the semiconductor art for an improved method of reducing reflection of light caused by changes in the refractive index at the interface(s) of layered materials in a semiconductor device during the alignment step in semiconductor processing and fabrication.

SUMMARY OF THE INVENTION

The present invention is directed to a method for reducing refraction and reflection occurring at the interface between adjacent layers of different materials in a semiconductor device during an alignment step in a semiconductor device fabrication process. The method comprises forming a corrective layer of material between layers of material which would otherwise be mutually adjacent, hereinafter termed "process" layers for clarity. Process layers comprise layers of material exhibiting differing refractive indexes applied during a semiconductor device fabrication process, and which would normally lie, after application, in a mutually adjacent relationship. The corrective layer is selected from a material having an index of refraction which lies between the indexes of refraction of the materials forming the process layers.

In another embodiment, there is disclosed a method for improving the laser alignment image intensity emanating from an alignment mark or other reflective surface (target indicia) in a multi-layered semiconductor device during an alignment process. The method comprises inserting a corrective layer of material at the interface between two or more process layers of material which would otherwise be mutually adjacent. The corrective layer is made of a material having an intermediate index of refraction relative to the indexes of refraction of the materials forming the process layers.

One particular embodiment of the improved method comprises forming a first process layer of material, having a first index of refraction, over a substrate surface of the semiconductor device. A corrective layer is formed over the first process layer and a second process layer, having a second index of refraction, is then formed over the corrective layer. The corrective layer is composed of a material having an intermediate index of refraction between the first index of refraction and the second index of refraction.

Where structures including additional material process layers are involved, the method can further comprise forming a second corrective layer, made from a material having a second intermediate index of refraction, over the second process layer. A third process layer, having a third index of refraction, is then formed over the second corrective layer. The second intermediate index of refraction lies between the third index of refraction and the second index of refraction.

The present method can also be modified to include additional layers of materials comprising refraction modification layers interposed between or above any of the aforementioned process layers. Likewise, any of the aforementioned structures can be further modified by forming an additional layer of material, having the requisite intermediate index of refraction, over an uppermost process layer to further reduce reflection occurring at the interface between the uppermost process layer and air.

The invention is also directed to semiconductor devices formed through the aforementioned methods.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
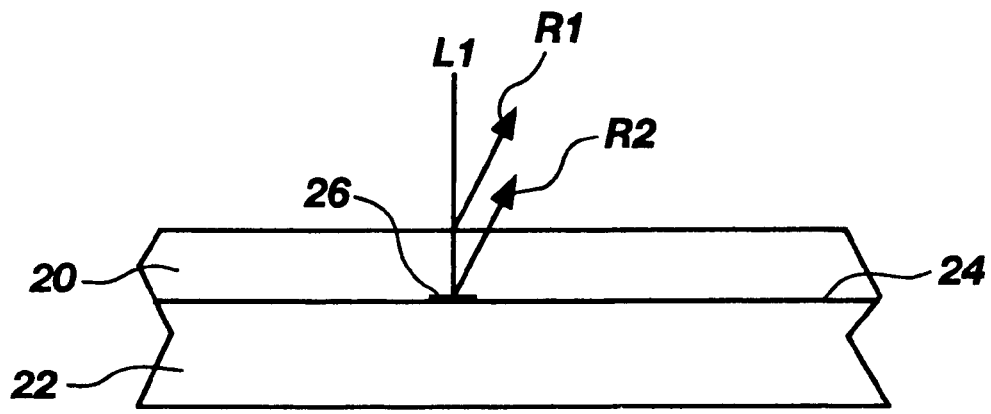
FIG. 1 is a cross-sectional view of a prior art semiconductor device illustrating reflection of light signals from the top surface, the interface between two adjacent process layers of materials, and an alignment mark in the semiconductor device.
Figure 2:
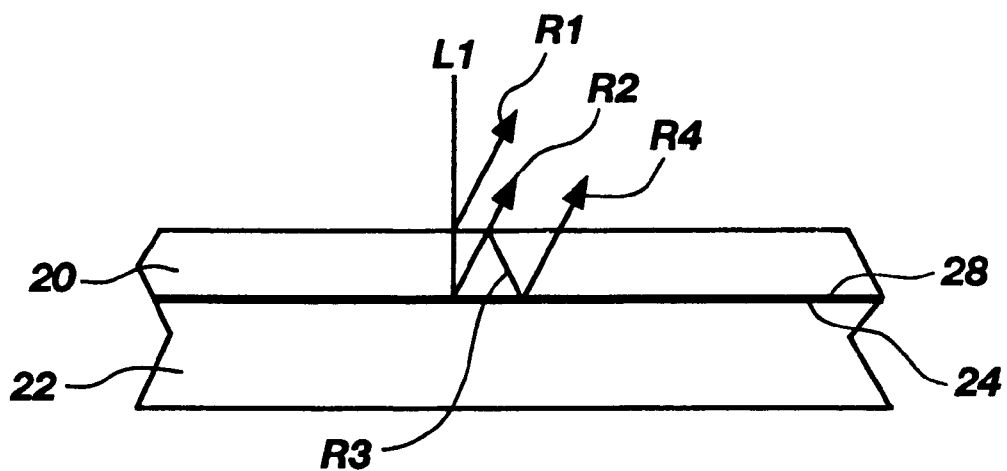
FIG. 2 is a cross-sectional view of a second prior art device illustrating the reflection of light signals from a reflective substrate surface.

Referring to FIGS. 1 through 4, it is described how the formation of corrective layers of materials according to the principles of the present invention reduces reflection and optical scattering of a light source reflected from a position-detecting area, target indicia, or alignment mark. FIGS. 1 and 2 illustrate two representative prior art structures in which a process layer 20, such as a resist layer, is formed on a substrate 22. These prior art structures are shown in order to more fully describe the novelty of the present invention.

FIG. 1 illustrates one embodiment of the prior art structure wherein a position-detecting target or alignment mark 26 is formed on a top surface 24 of the substrate 22. The substrate 22 is preferably made of a material having low reflectivity or anti-reflective properties in order to increase the resolution of the light signal being reflected from the alignment mark 26. Alternatively, the top surface 24 of the substrate 22 can be coated with a thin layer of the low- or anti-reflective material. The alignment mark 26 is typically constructed of a thin layer of reflective material, such as aluminum, and is of a predetermined width, preferably at least two times the diameter of a projected spot formed by a beam of light L1 emanating from an alignment apparatus (not shown), such as a stepper. For example, where the beam of light L1 consists of a laser beam having a projected laser spot of about 6 microns in diameter, the alignment mark 26 would typically have a width of about 12 microns. Where a plurality of alignment marks 26 is used, the alignment marks are usually spaced apart from each other at intervals of at least about half of the projected laser spot, i.e., at intervals of about 3 microns.

Although the present embodiment includes the aforementioned alignment marks 26, it is understood that the present structure can exclude the use of the alignment marks 26 and rely instead on reflection of the beam of light L1 directly from the top surface 24 of the substrate 22 to create a signal to carry out various alignment processes. This alternative process is particularly well suited where detection of varying topography underlying the light-penetrated layers is sought.

As previously mentioned, reflection is caused by differences in the indexes of refraction of the materials forming normally-adjacent process layers in the instant structures. An increase in the difference between the indexes of refraction of adjacent process layers produces an increase in the reflected intensity at the interface between the adjacent process layers. Specifically, this reflection causes a substantial loss of intensity and resolution of the light L1 travelling vertically downward before it reaches the alignment mark 26. Reflection of the light signal also interferes with intensity and phase information travelling vertically upwards from the alignment mark by decreasing the intensity and resolution of the light L1 reaching the alignment apparatus.

During the alignment procedure, the beam of light L1 emanating from the alignment apparatus undergoes substantial reflection R1 at the interface between the process layer 20 and the air above the process layer 20 (the air-process layer interface). The light L1 passing through the process layer 20 once again undergoes reflection at the interface between the process layer 20 and the alignment mark 26 (the process layer-alignment mark interface) or, alternatively, at the interface between the process layer 20 and the substrate 22 (the process layer-substrate interface) where an alignment mark is not included. In this fashion, a reflected portion of light L1 exits through the process layer 20 as emergent light R1 and R2, thus causing optical interference.

FIG. 2 shows a second embodiment of a prior art structure which is identical to the structure of FIG. 1, except that a reflective layer 28 (instead of the alignment mark 26) is formed to substantially cover the top surface 24 of the substrate 22. The reflective layer 28 can be made of any material possessing good reflective characteristics, such as aluminum and alloys thereof. As described with respect to the embodiment of FIG. 1, a portion of light L1 exits through the process layer 20 as emergent light R1 and R2. However, due to the presence of the additional reflective surface area of reflective layer 28, emergent light R2 is reflected R3 again at the air-process layer interface, once again reflecting from reflective layer 28 and exiting through the process layer 20 as emergent light R4. This process may occur a number of times within the process layer 20, leading to multiple reflected light signals, which create increased optical interference.

Figure 3:
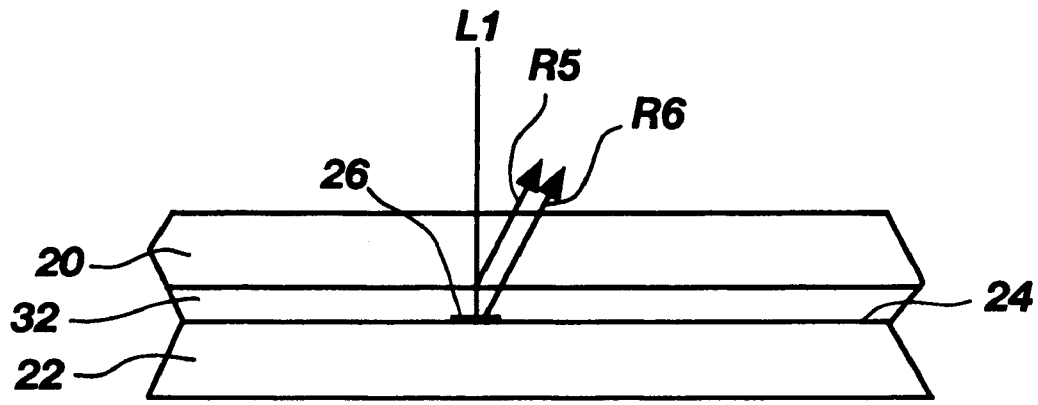
FIG. 3 is a cross-sectional view of a semiconductor device made in accordance with the principles of the present invention and illustrates the reduction of reflection due to the formation of a corrective layer between two process layers.

FIG. 3 illustrates a preferred embodiment of a structure formed according to the principles of the present invention in which a corrective layer 32 is formed on the top surface 24 of the substrate 22. For purposes of simplicity, elements common to FIGS. 1 and 2 will hereinafter be numbered identically in subsequent figures. FIG. 3 is representative of the structure depicted in FIG. 1, with the addition of a corrective layer. The provision of a corrective layer 32 is effective for reducing the reflection R2 (FIG. 1) occurring at the process layer-substrate interface.

This reduction in reflection occurs even though the light L1 now passes through two interfaces, the interface between the process layer 20 and the corrective layer 32 (process layer-corrective layer interface) and the interface between the corrective layer 32 and the substrate 22 (corrective layer-substrate interface), the substrate 22 in this instance comprising a second process layer. This reduced-reflection effect is due to the fact that the combination of emergent light R5 from the process layer-corrective layer interface and emergent light R6 from the corrective layer-substrate interface is of lower intensity than the emergent light R2 of FIG. 1 (i.e., R5+R6<R2).

Where the material which forms the process layer 20 has a first index of refraction $n_1$ and the material which forms the substrate 22 has a second index of refraction $n_2$, the corrective layer 32 is made from a material having an intermediate index of refraction $n_i$ that lies between the first and second indexes of refraction $n_1$ and $n_2$ (i.e., $n_1>n_i>n_2$, or $n_1<n_i<n_2$).

Figure 4:
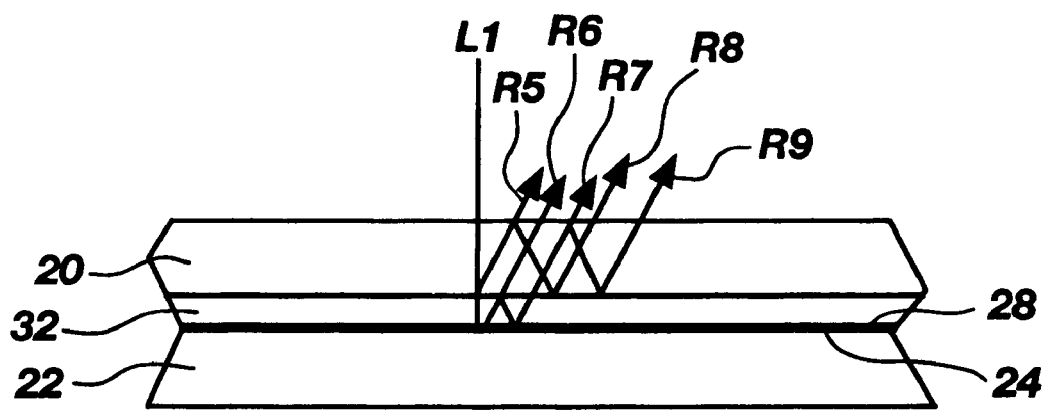
FIGS. 4–7 illustrate the reduction in reflection due to the formation of corrective layers in various embodiments of the semiconductor devices made in accordance with the principles of the present invention.

FIG. 4 illustrates a preferred embodiment of a structure formed according to the principles of the present invention wherein a corrective layer 32 is formed over the reflective layer 28 that substantially covers the top surface 24 of the substrate 22. FIG. 4 is representative of the structure depicted in FIG. 2, with the addition of a corrective layer. The provision of the corrective layer 32 is effective for reducing the multiple emergent light R2 and R4 signals normally occurring at the process layer-substrate interface (FIG. 2). As described above with respect to FIG. 3, the reduction in reflection is due to the fact that the combination of multiple emergent light signals R5, R8, and R9 from the process layer-corrective layer interface and the multiple emergent light signals R6 and R7 from the corrective layer-substrate interface is of lower intensity than the emergent light signals R2 and R4 of FIG. 2 (i.e., R5+R6+R7+R8+R9<R2+R4). Thus, formation of the corrective layer 32 reduces the intensity of multiple refractive light signals produced in a typical prior art structure, which, in turn, decreases optical interference in an alignment process.

Figure 5:
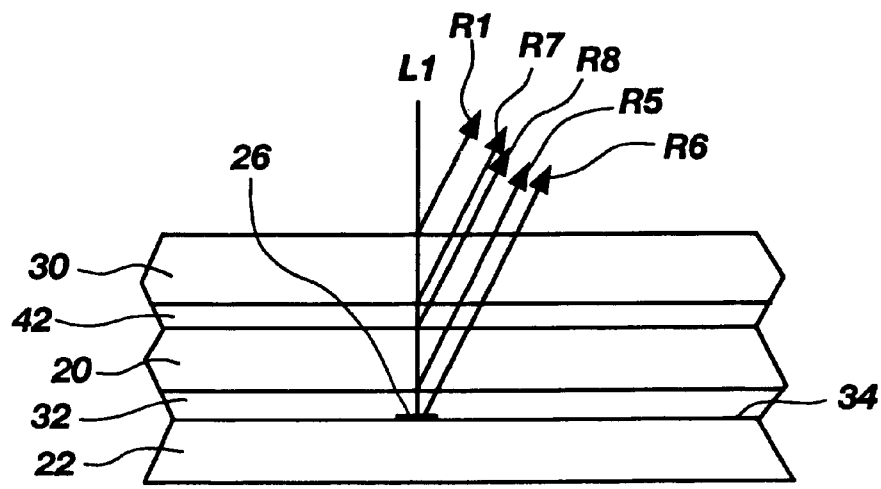

FIG. 5 shows a modified embodiment of the structure of FIG. 3 wherein a second corrective layer 42 and a third process layer 30, respectively, are disposed over the process layer 20. Consistent with the principles of the invention, the second corrective layer 42 is made of a material having a second intermediate index of refraction $n_{i2}$ between the first index of refraction $n_1$ of the process layer 20 and a third index of refraction $n_3$ of the third process layer 30 (i.e., $n_1>n_{i2}>n_3$, or $n_1<n_{i2}<n_3$).

As a result, the combination of emergent light signal R8 (reflected from the interface between the process layer 20 and the second corrective layer 42 interface) and emergent light signal R7 (reflected from the interface between the second corrective layer 42 and the third process layer 30) is of lower intensity than the emergent light signal (not shown) that would be reflected from the interface between the process layer 20 and the third process layer 30 prior to the formation of the second corrective layer 42 therebetween.

Figure 6:
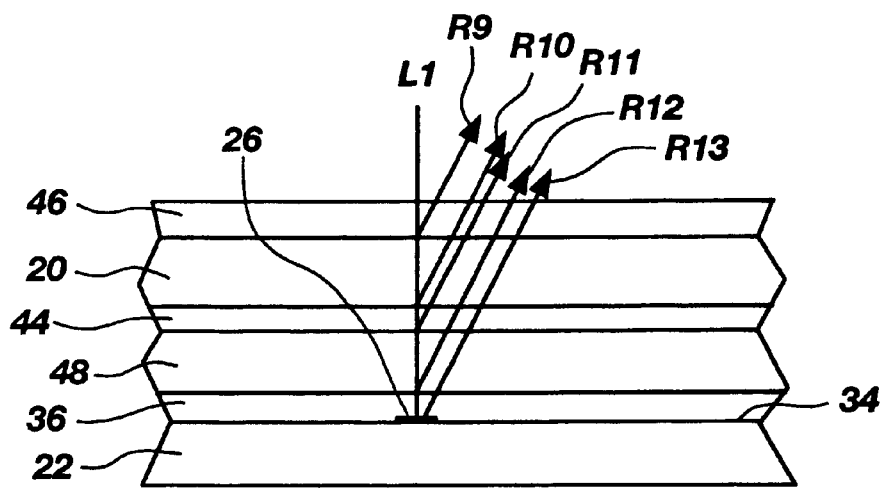

FIG. 6 shows yet another preferred embodiment of a structure made according to the method of the present invention. As in FIGS. 3 and 5, the present structure includes the substrate 22 and the process layer 20 disposed above the substrate 22. However, unlike the previously-described structures, this structure also includes a third corrective layer 36, a fourth process layer 48, and a fourth corrective layer 44, all of which are respectively formed between the substrate 22 and the process layer 20.

The third corrective layer 36 is formed over the substrate 22 and the fourth process layer 48 is formed over the third corrective layer 36. Consistent with the principles of the invention, the third corrective layer 36 is made of a material having an index of refraction that lies between the indexes of refraction of the materials forming the substrate 22 and the fourth process layer 48. As a result, the combination of emergent light signal R13 (reflected from the interface between the substrate 22 and the third corrective layer 36) and emergent light signal R12 (reflected from the interface between the third corrective layer 36 and the fourth process layer 48) is of lower intensity than the emergent light signal (not shown) that would be reflected from the interface between the substrate 22 and the fourth process layer 48, prior to the formation of the third corrective layer 36 therebetween.

In like manner, the fourth corrective layer 44 is made of a material having an index of refraction between the indexes of refraction of the fourth process layer 48 and the process layer 20. This results in emergent light signals R9 and R10, which, in combination, are of lower intensity than the emergent light signal (not shown) that would be reflected from the interface between the fourth process layer 48 and the process layer 20 in the absence of the fourth corrective layer 44 now disposed therebetween.

Finally, the embodiment shown in FIG. 6 further includes a fifth corrective layer 46, which is formed over the process layer 20. The fifth corrective layer 46 is made of a material having an index of refraction that lies between the index of refraction of the first process layer and the index of refraction of air. The formation of the fifth corrective layer 46 results in an emergent light signal R9 that is of lower intensity than the emergent light signal R1 (FIG. 1) typically reflected from the air-process layer interface.

Figure 7:
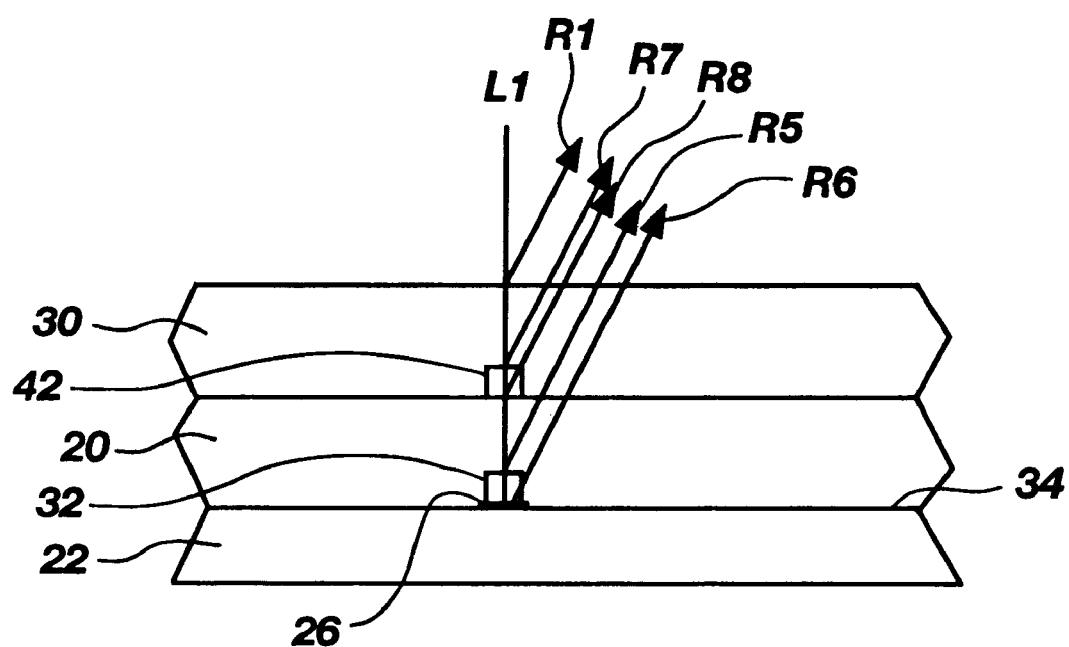

In FIG. 7 is shown a modified embodiment of the structure of FIG. 5, wherein the corrective layer 32 is selectively formed or deposited over the substrate 22 or the alignment mark 26, and wherein the second corrective layer 42 is selectively deposited or formed over the process layer 20. While this particular embodiment has been illustrated with reference to the structure of FIG. 5, it is understood that this method of selective deposition can be employed in any of the various embodiments illustrated thus far.

Although the preferred embodiments of the present invention have been disclosed for illustrative purposes, those skilled in the art will appreciate that various modifications, additions, and substitutions are possible, without departing from the scope and spirit of the invention as disclosed in the accompanying claims.

What is claimed is:

1. A semiconductor device or assembly having reduced light refraction comprising:

a first layer of the semiconductor device or assembly, the first layer having a first index of refraction;

a corrective layer deposited over the first layer; and a second layer deposited over the corrective layer, wherein the second layer has a second index of refraction and the corrective layer has an intermediate index of refraction that lies between the first index of refraction and the second index of refraction, thereby reducing reflection of light caused by changes in the refractive index between said first and said second layer.

2. The semiconductor device or assembly of claim 1, further comprising at least one reflective alignment mark formed on a top surface of the first layer.

3. The semiconductor device or assembly of claim 2, wherein the corrective layer is selectively formed over portions of the top surface of first layer having the at least one reflective alignment mark.

4. The semiconductor device or assembly of claim 1, further comprising a reflective layer deposited on a top surface of the first layer to substantially cover the top surface of the first layer.

5. The semiconductor device or assembly of claim 1, wherein the first layer is deposited over a substrate.

6. The semiconductor device or assembly of claim 5, wherein at least one additional layer is deposited between the first layer and the substrate.

7. The semiconductor device or assembly of claim 1, further comprising at least one additional layer deposited over the second layer.

8. The semiconductor device or assembly of claim 1, further comprising a second corrective layer deposited over the second layer, the second corrective layer having a second intermediate index of refraction; and a third layer deposited over the second corrective layer, the third layer having a third index of refraction, wherein the second intermediate index of refraction lies between the third index of refraction and the second index of refraction.

9. The semiconductor device of claim 8 further comprising at least one reflective alignment mark on a top surface of the first layer and, wherein the second corrective layer is selectively formed over portions of a top surface of the second layer overlying the at least one reflective alignment mark.

10. The semiconductor device of claim 8, further comprising forming a third corrective layer over the third layer, the third corrective layer having a third intermediate index of refraction that lies between an index of refraction of air and the third index of refraction.

11. The semiconductor device of claim 10 further comprising at least one reflective alignment mark on a top surface of the first layer and, wherein the third corrective layer is selectively formed over portion op surface of the third layer overlying the at least one reflective alignment mark.

12. A semiconductor device assembly formed by the method comprising:

forming a first layer of the semiconductor assembly, the first layer having a first index of refraction;

forming a corrective layer over the first layer; and forming a second layer over the corrective layer, wherein the second layer has a second index of refraction and the corrective layer has an intermediate index of refraction that lies between the first index of refraction and the second index of refraction, thereby reducting reflection of light caused by changes in the reflective index between said first and said second layer.

13. The assembly of claim 12, wherein the first layer is formed over a substrate of the semiconductor assembly.

14. The assembly of claim 12, wherein the first layer is a semiconductor substrate.

15. The assembly of claim 12, further comprising forming at least one reflective alignment mark on a top sur f the first layer.

16. The assembly of claim 15, wherein the corrective layer is selectively formed over portions of the top surface of the first layer having the at least one reflective alignment mark.

17. The assembly of claim 12, further comprising forming a reflective layer on a top surface of the first layer to substantially cover the top surface of the first layer.

18. The assembly of claim 12, further comprising forming a second corrective layer over the second layer, the second corrective layer having a second intermediate index of refraction that lies between an index of refraction of air and the second index of refraction.

19. The assembly of claim 18 further comprising forming at least one reflective alignment mark on a top surface of the first layer and wherein the second corrective layer is selectively formed over portions of the second layer overlying the at least one reflective alignment mark.

20. The assembly of claim 12, further comprising:
   a second corrective layer over the second layer, the second corrective layer having a second intermediate index of refraction; and
   a third layer over the second corrective layer, the third layer having a third index of refraction, wherein the second intermediate index of refraction lies between the third index of refraction and the second index of refraction.

21. The assembly of claim 20, further comprising a third corrective layer over the third layer, the third corrective layer having a third intermediate index of refraction that lies between an index of refraction of air and the third index of refraction.

22. The assembly of claim 21 further comprising forming at least one reflective alignment mark on a top surface of the first layer and wherein the third corrective layer is selectively formed over portions of the third layer overlying the at least one reflective alignment mark.

23. The assembly of claim 18, further comprising at least one reflective alignment mark on a top surface of the first layer.

24. The assembly of claim 20 further comprising forming at least one reflective alignment mark on a top surface of the first layer and wherein the second corrective layer is selectively formed over portions of a top surface of the second layer overlying the at least one reflective alignment mark.

* * * * *

UNITED STATES PATENT AND TRADEMARK OFFICE
CERTIFICATE OF CORRECTION

PATENT NO. : 6,060,785
DATED : May 9, 2000
INVENTOR(S) : New et al.

It is certified that error appears in the above-identified patent and that said Letters Patent is hereby corrected as shown below:

Title page,
In Item [56] "References Cited, U.S. PATENT DOCUMENTS", first entry, change "4,007,846  2/1977  Tustison et al." to -- 4,907,846  3/1990  Tustison et al. --

In Item [56] "References Cited, U.S. PATENT DOCUMENTS", 8th entry, change "Hashimotoe et al." to -- Hashimoto et al. --

Drawings,
Figs. 5, 6, and 7, change reference numeral "34" to -- 24 --;

Column 1,
Line 6, change "CROSS REFERENCE" to -- CROSS-REFERENCE --;

Column 5,
Line 47, after "reflected" insert -- as emergent light --; and

Column 7,
Line 16, change "R9 and R10," to -- R10 and R11, --.

Column 7, claim 1,
Line 58, after "first" insert -- layer --;

Column 7, claim 3,
Line 64, after "surface of" insert -- the --;

Column 8, claim 8,
Line 12, after "comprising" insert -- : --;

Column 8, claim 9,
Line 21, after "device" insert -- or assembly --;

Column 8, claim 10,
Line 27, after "device" insert -- or assembly --;

Column 8, claim 11,
Line 32, after "device" insert -- or assembly --;
Line 35, change "portion op surface" to -- portions of a top surface --;

UNITED STATES PATENT AND TRADEMARK OFFICE
CERTIFICATE OF CORRECTION

PATENT NO. : 6,060,785
DATED : May 9, 2000
INVENTOR(S) : New et al.

It is certified that error appears in the above-identified patent and that said Letters Patent is hereby corrected as shown below:

Column 8, claim 12,
Line 40, after "semiconductor" insert -- device --;
Line 48, change "reflective" to -- refractive --;
Line 49, after "first" insert -- layer --;

Column 8, claim 13,
Line 51, after "semiconductor" insert -- device --; and

Column 8, claim 15,
Line 55, change "sur f" to -- surface of --.

Signed and Sealed this

Fourth Day of December, 2001

Attest:

*Attesting Officer*

NICHOLAS P. GODICI
*Acting Director of the United States Patent and Trademark Office*